United States Patent
Yoshino et al.

(10) Patent No.: US 11,495,435 B2
(45) Date of Patent: Nov. 8, 2022

(54) SUBSTRATE PROCESSING APPARATUS, NON-TRANSITORY COMPUTER-READABLE RECORDING MEDIUM, METHOD OF MANUFACTURING SEMICONDUCTOR DEVICE, AND A SUBSTRATE PROCESSING METHOD

(71) Applicant: Kokusai Electric Corporation, Tokyo (JP)

(72) Inventors: Teruo Yoshino, Toyama (JP); Takashi Yahata, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 124 days.

(21) Appl. No.: 16/874,312

(22) Filed: May 14, 2020

(65) Prior Publication Data
US 2020/0365367 A1 Nov. 19, 2020

(30) Foreign Application Priority Data
May 17, 2019 (JP) .............................. JP2019-093639

(51) Int. Cl.
*H01J 37/32* (2006.01)

(52) U.S. Cl.
CPC ..... *H01J 37/3211* (2013.01); *H01J 37/32091* (2013.01); *H01J 37/32174* (2013.01); *H01J 37/32577* (2013.01); *H01J 2237/334* (2013.01)

(58) Field of Classification Search
CPC ........................ H01J 37/3211; H01J 37/32577
See application file for complete search history.

(56) References Cited

U.S. PATENT DOCUMENTS 7,504,041 B2   3/2009 Chandrachood et al.
10,109,459 B1 * 10/2018 Rhee ..................... H01J 37/321
(Continued)

FOREIGN PATENT DOCUMENTS

JP   2003-037101 A   2/2003
JP   2012-33958 A    2/2012
(Continued)

OTHER PUBLICATIONS

Office Action in corresponding Taiwan Patent Application No. 109108986, dated Jul. 7, 2021, with English translation.
(Continued)

*Primary Examiner* — Binh X Tran
(74) *Attorney, Agent, or Firm* — Edell, Shapiro & Finnan, LLC (57) ABSTRACT

Described herein is a technique capable of capable of uniformly processing a surface of a substrate even when an inductive coupling type substrate processing apparatus is used. According to one aspect of the technique, there is provided a substrate processing apparatus including: a process chamber in which a substrate is processed; a gas supply part configured to supply a gas into the process chamber; a high frequency power supply part configured to supply a high frequency power; a plasma generator including a resonance coil wound on a side of the process chamber, the plasma generator configured to generate a plasma in the process chamber when the high frequency power is supplied to the resonance coil; and a substrate support on which the substrate is placed such that a horizontal center position of the substrate in the process chamber does not overlap with a horizontal center position of the resonance coil.

10 Claims, 8 Drawing Sheets

(56) References Cited

U.S. PATENT DOCUMENTS

| | | | |
|---|---|---|---|
| 2003/0106645 A1* | 6/2003 | Ni | H01J 37/321 |
| | | | 156/345.48 |
| 2007/0257009 A1 | 11/2007 | Chandrachood et al. | |
| 2011/0278260 A1* | 11/2011 | Lai | H01J 37/32532 |
| | | | 216/68 |
| 2012/0252220 A1 | 10/2012 | Harada et al. | |
| 2015/0252474 A1* | 9/2015 | Itatani | C23C 16/45536 |
| | | | 438/758 |
| 2018/0195173 A1 | 7/2018 | Kato et al. | |
| 2020/0219699 A1 | 7/2020 | Yasui et al. | |

FOREIGN PATENT DOCUMENTS

| | | |
|---|---|---|
| JP | 2012-216774 A | 11/2012 |
| JP | 2014-170634 A | 9/2014 |
| JP | 2015-181149 A | 10/2015 |
| JP | 2019-36513 A | 3/2019 |
| KR | 10-2018-0082958 A | 7/2018 |
| TW | 2012-15250 A | 4/2012 |
| TW | 2012-34934 A | 8/2012 |
| TW | I376429 B | 11/2012 |
| WO | 20110125471 A1 | 10/2011 |
| WO | 2019082569 A1 | 5/2019 |

OTHER PUBLICATIONS

Office Action in corresponding Japanese Patent Application No. 2019-093639, drafted Mar. 11, 2021, with English translation.
Office Action in corresponding Korean Patent Application No. 10-2020-0056935, dated Sep. 1, 2021, with English translation.

* cited by examiner

SUBSTRATE PROCESSING APPARATUS, NON-TRANSITORY COMPUTER-READABLE RECORDING MEDIUM, METHOD OF MANUFACTURING SEMICONDUCTOR DEVICE, AND A SUBSTRATE PROCESSING METHOD

CROSS REFERENCE TO RELATED APPLICATIONS

This application claims foreign priority under 35 U.S.C. § 119(a)-(d) to Application No. JP 2019-093639 filed on May 17, 2019, the entire contents of which are hereby incorporated by reference.

TECHNICAL FIELD

The present disclosure relates to a substrate processing apparatus.

BACKGROUND

In order to process a semiconductor substrate (also simply referred to as a "substrate"), the substrate may be processed by supplying a gas in a plasma state onto the substrate. As a method of generating a plasma, a capacitive coupling method using parallel plate electrodes and an inductive coupling method using a resonance coil may be used. For example, the resonance coil is provided around a plasma generation chamber, and the plasma is generated in the plasma generation chamber by supplying electric power to the resonance coil. According to related arts, a substrate processing apparatus using the inductive coupling method (hereinafter, also referred to as an "inductive coupling type substrate processing apparatus") is disclosed.

However, according to the inductive coupling type substrate processing apparatus, a plasma density may not be uniformized in the plasma generation chamber due to a positional relationship between the resonance coil and the plasma generation chamber. Therefore, a substrate processing on a surface of the substrate may not be uniformized.

SUMMARY

Described herein is a technique capable of uniformly processing a surface of a substrate even when an inductive coupling type substrate processing apparatus is used to process the substrate.

According to one aspect of the technique of the present disclosure, there is provided a substrate processing apparatus including: a process chamber in which a substrate is processed; a gas supply part configured to supply a gas into the process chamber; a high frequency power supply part configured to supply a high frequency power of a predetermined frequency; a plasma generator including a resonance coil wound on a side of the process chamber, the plasma generator configured to generate a plasma in the process chamber when the high frequency power is supplied to the resonance coil; and a substrate support on which the substrate is placed such that a horizontal center position of the substrate in the process chamber does not overlap with a horizontal center position of the resonance coil.

DETAILED DESCRIPTION

Hereinafter, one or more embodiments (also simply referred to as "embodiments") according to the technique of the present disclosure will be described with reference to the drawings.

(1) Configuration of Substrate Processing Apparatus

Hereinafter, a substrate processing apparatus according to the embodiments will be described with reference to FIGS. 1 through 6. For example, the substrate processing apparatus according to the embodiments is configured to perform a substrate processing such as an oxidation process onto a film formed on a surface of a substrate.

Process Chamber

Figure 1:
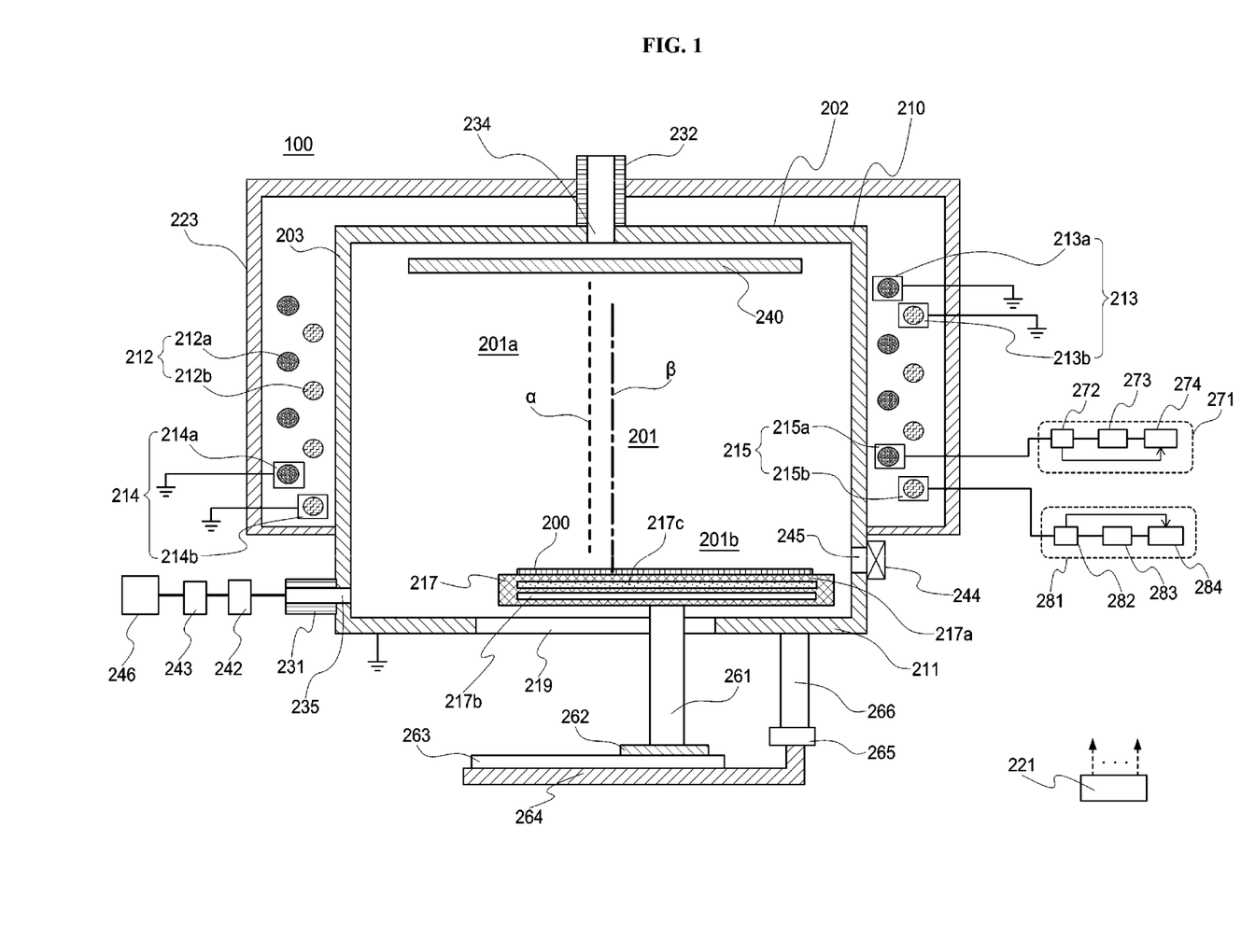
FIG. 1 schematically illustrates a vertical cross-section of a substrate processing apparatus according to one or more embodiments described herein.

A substrate processing apparatus 100 includes a process furnace 202 in which a substrate 200 is processed by a plasma. The process furnace 202 includes a process vessel 203. A process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. For example, the upper vessel 210 is made of a nonmetallic material such as aluminum oxide ($Al_2O_3$) and quartz ($SiO_2$), and the lower vessel 211 is made of a material such as aluminum (Al).

A gate valve 244 is provided on a lower side wall of the lower vessel 211. While the gate valve 244 is open, the substrate 200 can be transferred (loaded) into the process chamber 201 through a substrate loading/unloading port 245 using a substrate transfer mechanism (not shown) or be transferred (unloaded) out of the process chamber 201 through the substrate loading/unloading port 245 using the substrate transfer mechanism. While the gate valve 244 is closed, the gate valve 244 maintains the process chamber 201 airtight.

A resonance coil 212 is wound on a side of the process chamber 201. In the process chamber 201, a space adjacent to the resonance coil 212 is referred to as a "plasma generation space 201a", and a space that communicates with the plasma generation space 201a and in which the substrate 200 is processed is referred to as a "substrate processing space 201b". Specifically, the plasma generation space 201a refers to a space where the plasma is generated, for example, a space above a lower end of the resonance coil 212 and below an upper end of the resonance coil 212 in the process chamber 201. The substrate processing space 201b refers to a space in which the substrate 200 is processed by the plasma, for example, a space below the lower end of the resonance coil 212. According to the embodiments, a diameter of the plasma generation space 201a in a horizontal direction is substantially the same as that of the substrate processing space 201b in the horizontal direction.

Substrate Support

A substrate support 217 serving as a substrate support part is provided at a center of a bottom portion of the process chamber 201. The substrate 200 can be placed on the substrate support 217. For example, the substrate support 217 is made of a nonmetallic material such as aluminum nitride (AlN), ceramics and quartz. The substrate support 217 is configured to reduce a metal contamination on a structure such as a film formed on the substrate 200. The substrate support 217 is also referred to as a "substrate supporter".

A heater 217b serving as a heating mechanism and an impedance adjustment electrode 217c are embedded in the substrate support 217. When electric power is supplied to the heater 217b, the heater 217b is configured to heat the substrate 200 such that a surface temperature of the substrate 200 may range, for example, from about 25° C. to about 850° C. The substrate support 217 is electrically insulated from the lower vessel 211.

The impedance adjustment electrode 217c is connected to an impedance variable mechanism (not shown). The impedance variable mechanism is constituted by components such as a resonance coil (not shown) and a variable capacitor (not shown). The impedance variable mechanism is configured to change an impedance thereof from about 0Ω to a parasitic impedance value of the process chamber 201 by controlling the inductance and resistance of the resonance coil (not shown) and the capacitance value of the variable capacitor (not shown). Therefore, it is possible to control the potential (bias voltage) of the substrate 200 via the impedance adjustment electrode 217c and the substrate support 217.

According to the embodiments, as described later, it is possible to improve a uniformity of a density of the plasma generated on the substrate 200. Therefore, when the uniformity of the density of the plasma falls within a desired range, it is not necessary to control the bias voltage of the substrate 200 using the impedance adjustment electrode 217c. In such a case, the impedance adjustment electrode 217c may not be provided in the substrate support 217. However, for the purpose of further improving the uniformity, it is possible to control the bias voltage of the substrate 200 using the impedance adjustment electrode 217c even when the uniformity falls within the desired range.

A shaft 261 configured to support a horizontal center of the substrate support 217 is connected to the substrate support 217. A lower portion of the shaft 261 protrudes outside the process chamber 201 via a through-hole 219 of a circular shape provided at a bottom portion of the lower vessel 211. A rotating mechanism 262 configured to rotate the shaft 261 is provided at a lower end of the shaft 261. By rotating the shaft 261 by the rotating mechanism 262, the substrate support 217 is rotated (that is, a spinning movement of the substrate support 217 is performed).

The rotating mechanism 262 is supported by a revolving mechanism 263. The revolving mechanism 263 is configured to drive the shaft 261 to revolve around a specific axis in the process chamber 201. By driving the shaft 261 to revolve around the specific axis by the revolving mechanism 263, the substrate support 217 revolves around the specific axis. According to the embodiments, the revolving mechanism 263 is supported by a support portion 264. The rotating mechanism 262 and the revolving mechanism 263 may be collectively referred to as a "rotating part" or a "rotating apparatus".

The support portion 264 is connected to a shaft 266 via an elevating mechanism 265. For example, the shaft 266 is fixed to the lower vessel 211. By controlling the elevating mechanism 265 to elevate or lower the support portion 264, the substrate support 217 is elevated or lowered. The elevating mechanism 265 and the shaft 266 may be collectively referred to as an "elevating part" or an "elevating apparatus".

A substrate placing surface 217a of a circumferential shape is provided on a surface of the substrate support 217. A central axis of the substrate placing surface 217a is configured to coincide with a central axis of the shaft 261. A diameter of the substrate placing surface 217a is set slightly larger than a diameter of the substrate 200. When the substrate 200 is placed on the substrate support 217, a center of the substrate placing surface 217a overlaps a center of the substrate 200.

A diameter of the through-hole 219 is set so that the shaft 261 does not contact with the through-hole 219 when the shaft 261 revolves around the specific axis. A bellows (not shown) is provided so as to surround components such as the shaft 261. The bellows is configured to maintain a vacuum degree of the process chamber 201.

Gas Supply Part

A gas supply pipe 232 is connected above the process chamber 201 (that is, on an upper portion of the upper vessel 210) so as to communicate with a gas introduction port (also referred to as a "gas inlet") 234. A shield plate 240 of a disk shape is provided below the gas introduction port 234. A gas supplied through the gas supply pipe 232 is supplied to the plasma generation space 201a via the gas introduction port 234. When the gas is supplied to the plasma generation space 201a, the gas collides with the shield plate 240 and is diffused toward the resonance coil 212.

Figure 2:
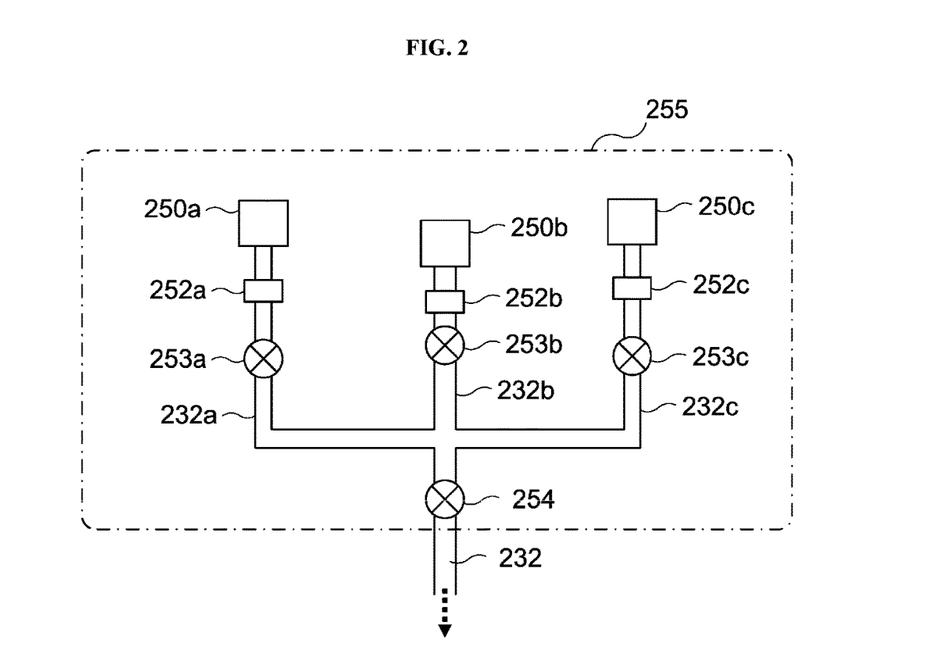
FIG. 2 schematically illustrates a gas supply part of the substrate processing apparatus according to the embodiments described herein.

As shown in FIG. 2, a downstream end of an oxygen-containing gas supply pipe 232a configured to supply an oxygen ($O_2$) gas serving as an oxygen-containing gas, a downstream end of an hydrogen-containing gas supply pipe 232b configured to supply an hydrogen ($H_2$) gas serving as a hydrogen-containing gas, and a downstream end of an inert gas supply pipe 232c configured to supply an argon (Ar) gas serving as an inert gas is connected to join the gas supply pipe 232.

An oxygen ($O_2$) gas supply source 250a, a mass flow controller (MFC) 252a serving as a flow rate controller (flow rate control mechanism) and a valve 253a serving as an opening/closing valve are provided at the oxygen-containing gas supply pipe 232a in order from an upstream side to a downstream side of the oxygen-containing gas supply pipe 232a. An oxygen-containing gas supply part (also referred to as an "oxygen-containing gas supply system") is constituted by the oxygen-containing gas supply pipe 232a, the MFC 252a and the valve 253a. The oxygen-containing gas supply part may also be referred to as a "first process gas supply part" or a "first process gas supply system".

A hydrogen ($H_2$) gas supply source 250b, a mass flow controller (MFC) 252b and a valve 253b are provided at the hydrogen-containing gas supply pipe 232b in order from an upstream side to a downstream side of the hydrogen-containing gas supply pipe 232b. A hydrogen-containing gas supply part (also referred to as a "hydrogen-containing gas supply system") is constituted by the hydrogen-containing gas supply pipe 232b, the MFC 252b and the valve 253b. The hydrogen-containing gas supply part may also be referred to as a "second process gas supply part" or a "second process gas supply system".

An argon (Ar) gas supply source 250c, a mass flow controller (MFC) 252c and a valve 253c are provided at the inert gas supply pipe 232c in order from an upstream side to a downstream side of the inert gas supply pipe 232c. An inert gas supply part (also referred to as an "inert gas supply system") is constituted by the inert gas supply pipe 232c, the MFC 252c and the valve 253c.

A valve 254 is provided on a downstream side portion where the oxygen-containing gas supply pipe 232a, the hydrogen-containing gas supply pipe 232b and the inert gas supply pipe 232c join. Each of the oxygen-containing gas supply pipe 232a, the hydrogen-containing gas supply pipe 232b and the inert gas supply pipe 232c is configured to communicate with the gas introduction port 234. It is possible to supply process gases such as the oxygen-containing gas, the hydrogen-containing gas and the inert gas into the process chamber 201 via the gas supply pipes 232a, 232b and 232c by opening and closing the valves 253a, 253b, 253c and 254 while adjusting the flow rates of the respective gases by the MFCs 252a, 252b and 252c.

A gas supply part (also referred to as a "gas supply system") 255 is constituted by the first process gas supply part, the second process gas supply part and the inert gas supply part. According to the embodiments, since the oxygen gas, the hydrogen gas and the inert gas are used, the gas supply part 255 is constituted by the first process gas supply part, the second process gas supply part and the inert gas supply part. However, the gas supply part 255 according to the embodiments is not limited thereto. For example, one of the first process gas supply part, the second process gas supply part and the inert gas supply part or a combination thereof may be individually or collectively referred to as the gas supply part 255.

The substrate processing apparatus 100 according to the embodiments is configured to perform the oxidation process by supplying the $O_2$ gas serving as the oxygen-containing gas through the oxygen-containing gas supply system. However, a nitrogen-containing gas supply system (also referred to as a "nitrogen-containing gas supply part") configured to supply a nitrogen-containing gas into the process chamber 201 may be provided instead of the oxygen-containing gas supply system. According to the substrate processing apparatus configured as described above (that is, the nitrogen-containing gas supply system is provided instead of the oxygen-containing gas supply system), a nitridation process may be performed instead of the oxidation process onto the substrate 200. In such a case, for example, a nitrogen ($N_2$) gas supply source (not shown) serving as a nitrogen-containing gas supply source is provided instead of the oxygen ($O_2$) gas supply source 250a, and the oxygen-containing gas supply pipe 232a may serve as a nitrogen-containing gas supply pipe.

Exhaust Part

A gas exhaust port 235 is provided on a side wall of the lower vessel 211. The gas such as a reactive gas (that is, one of the process gases) is exhausted from the process chamber 201 through the gas exhaust port 235. An upstream end of a gas exhaust pipe 231 is connected to the lower vessel 211 so as to communicate with the gas exhaust port 235. An APC (Automatic Pressure Controller) valve 242 serving as a pressure controller (pressure adjusting mechanism), a valve 243 serving as an opening/closing valve and a vacuum pump 246 serving as a vacuum exhaust device are provided at the gas exhaust pipe 231 in order from an upstream side to a downstream side of the gas exhaust pipe 231.

An exhaust part (also referred to as an "exhaust system") is constituted mainly by the gas exhaust pipe 231, the APC valve 242 and the valve 243. The exhaust part may further include the vacuum pump 246.

Plasma Generator

The resonance coil 212 of a helical shape is provided so as to surround the process chamber 201 around an outer peripheral portion of the process chamber 201, that is, around an outer portion of a side wall of the upper vessel 210. The resonance coil 212 includes a resonance coil 212a serving as a first electrode and a resonance coil 212b serving as a second electrode. A conductor constituting the resonance coil 212a and a conductor constituting the resonance coil 212b are alternately provided in a vertical direction. The resonance coil 212a may also be referred to as a "first resonance coil", and the resonance coil 212b may also be referred to as a "second resonance coil". The conductor constituting the resonance coil 212a may also be referred to as a "first conductor", and the conductor constituting the resonance coil 212b may also be referred to as a "second conductor".

The resonance coil 212a and the resonance coil 212b are arranged such that a center axis α in a radial direction of the resonance coil 212a does not overlap with a center axis β in a radial direction of the resonance coil 212b. Thereby, a donut-shaped induction plasma 293 (described later) generated by the resonance coil 212a and a donut-shaped induction plasma 296 (described later) generated by the resonance coil 212b are displaced with each other in the radial direction. Therefore, it is possible to expand a plasma generation region. The details will be described later.

The central axis α is arranged at a position that does not overlap with a horizontal center position of the substrate placing surface 217a. Similarly, the central axis β is arranged at a position that does not overlap with the horizontal center position of the substrate placing surface 217a.

An RF (radio frequency) sensor 272, a high frequency power supply 273 and a matching device 274 configured to match an impedance or an output frequency of the high frequency power supply 273 are connected to the resonance coil 212a.

The high frequency power supply 273 is configured to supply a high frequency power (also referred to as an "RF power") to the resonance coil 212a. The RF sensor 272 is provided at an output side of the high frequency power supply 273. The RF sensor 272 monitors information of a traveling wave or a reflected wave of the supplied high frequency power. The power of the reflected wave monitored by the RF sensor 272 is input to the matching device 274. The matching device 274 is configured to control the impedance of the high frequency power supply 273 or the output frequency of the high frequency power so as to minimize the reflected wave based on the information on the reflected wave input from the RF sensor 272.

The high frequency power supply 273 includes a power supply controller (not shown) and an amplifier (not shown). The power supply controller may also be referred to as a "control circuit", and the amplifier may also be referred to as an "output circuit". The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant high frequency power to the resonance coil 212a via a transmission line.

The high frequency power supply 273, the matching device 274 and the RF sensor 272 may be collectively referred to as a "high frequency power supply part" 271. The high frequency power supply part 271 may also be referred to as a high frequency power supply system 271. One of the high frequency power supply 273, the matching device 274 and the RF sensor 272 or a combination thereof may be individually or collectively referred to as the high frequency power supply part 271. The high frequency power supply part 271 may also be referred to as a first high frequency power supply part 271.

An RF (radio frequency) sensor 282, a high frequency power supply 283 and a matching device 284 configured to match an impedance or an output frequency of the high frequency power supply 283 are connected to the resonance coil 212b.

The high frequency power supply 283 is configured to supply a high frequency power (also referred to as an "RF power") to the resonance coil 212b. The RF sensor 282 is provided at an output side of the high frequency power supply 283. The RF sensor 282 monitors information of a traveling wave or a reflected wave of the supplied high frequency power. The power of the reflected wave monitored by the RF sensor 282 is input to the matching device 284. The matching device 284 is configured to control the impedance of the high frequency power supply 283 or the output frequency of the high frequency power so as to minimize the reflected wave based on the information on the reflected wave input from the RF sensor 282.

The high frequency power supply 283 includes a power supply controller (not shown) and an amplifier (not shown). The power supply controller may also be referred to as a "control circuit", and the amplifier may also be referred to as an "output circuit". The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant high frequency power to the resonance coil 212b via a transmission line.

The high frequency power supply 283, the matching device 284 and the RF sensor 282 may be collectively referred to as a "high frequency power supply part" 281. The high frequency power supply part 281 may also be referred to as a high frequency power supply system 281. One of the high frequency power supply 283, the matching device 284 and the RF sensor 282 or a combination thereof may be individually or collectively referred to as the high frequency power supply part 281. The high frequency power supply part 281 may also be referred to as a second high frequency power supply part 281. The first high frequency power supply part 271 and the second high frequency power supply part 281 may be collectively referred to as a "high frequency power supply part" or a "high frequency power supply system".

A winding diameter, a winding pitch and the number of winding turns of each of the resonance coil 212a and the resonance coil 212b are set such that each of the resonance coil 212a and the resonance coil 212b resonates in a full-wavelength mode to form a standing wave of a predetermined wavelength. That is, an electrical length of the resonance coil 212a is set to an integral multiple of a wavelength of a predetermined frequency of the high frequency power supplied from the high frequency power supply part 271. For example, the electrical length of the resonance coil 212a is one or two times the wavelength. An electrical length of the resonance coil 212b is set to an integral multiple of a wavelength of a predetermined frequency of the high frequency power supplied from the high frequency power supply part 281. For example, the electrical length of the resonance coil 212b is one or two times the wavelength.

Specifically, considering the conditions such as the power to be applied, a strength of a magnetic field to be generated and shapes of the substrate processing apparatus 100 to be applied, each of the resonance coil 212a and the resonance coil 212b having an effective cross-section of 50 mm2 to 300 mm2 and a diameter of 200 mm to 500 mm is wound, for example, twice to 60 times around an outer circumferential side of the process chamber 201 defining the plasma generation space 201a such that the magnetic field of about 0.01 Gauss to about 10 Gauss can be generated by the high frequency power having a frequency of 800 kHz to 50 MHz and a power of 0.5 KW to 5 KW.

For example, when the predetermined frequency is 13.56 MHz, the wavelength is about 22 meters. When the predetermined frequency is 27.12 MHz, the wavelength is about 11 meters. Preferably, the electrical length of each of the resonance coil 212a and the resonance coil 212b is set equal to the wavelength. According to the embodiments, the predetermined frequency is set to 27.12 MHz, and the electrical length of each of the resonance coil 212a and the resonance coil 212b is set equal to the wavelength (for example, about 11 meters).

The resonance coil 212a is provided such that the winding pitch of the resonance coil 212a is, for example, at equal intervals of 24.5 mm. The winding diameter (diameter) of the resonance coil 212a is set to be larger than the diameter of the substrate 200. According to the embodiments, the diameter of the substrate 200 is set to 300 mm, and the winding diameter of the resonance coil 212a is set to 500 mm, which is larger than the diameter of the substrate 200.

The resonance coil 212b is provided such that the winding pitch of the resonance coil 212b is, for example, at equal intervals of 24.5 mm. The winding diameter (diameter) of the resonance coil 212b is set to be larger than the diameter of the substrate 200. According to the embodiments, the diameter of the substrate 200 is set to 300 mm, and the winding diameter of the resonance coil 212b is set to 500 mm, which is larger than the diameter of the substrate 200.

For example, a copper pipe, a copper thin plate, an aluminum pipe, an aluminum thin plate, a material obtained by depositing copper or aluminum on a polymer belt may be used as a material constituting the resonance coil 212a and the resonance coil 212b. The resonance coil 212 (that is, each of the resonance coil 212a and the resonance coil 212b) is made of an insulating material of a plate shape.

Both ends of each of the resonance coil 212a and the resonance coil 212b are electrically grounded. However, at least one end of each of the resonance coil 212a and the resonance coil 212b may be grounded via movable taps 213 (that is, a movable tap 213a and a movable tap 213b) in order to fine-tune an electrical length of each of the resonance coil 212a and the resonance coil 212b when the substrate processing apparatus 100 is initially installed or when the processing conditions of the substrate processing apparatus 100 are changed. A reference numeral 214 in FIG.

1 indicates fixed grounds of the other end of the resonance coil 212. That is, a reference numeral 214a in FIG. 1 indicates a fixed ground of the other end of the resonance coil 212a and a reference numeral 214b in FIG. 1 indicates a fixed ground of the other end of the resonance coil 212b. In addition, power feeding parts (not shown) are provided between the grounded ends of the resonance coil 212a and the resonance coil 212b. The power feeding parts are constituted by movable taps 215 (that is, a movable tap 215a and a movable tap 215b) which will be described later.

A position of the movable tap 213a may be adjusted in order for the resonance characteristics of the resonance coil 212a to become approximately same as those of the high frequency power supply 273. In order to fine-tune an impedance of the resonance coil 212a when the substrate processing apparatus 100 is initially installed or when the processing conditions of the substrate processing apparatus 100 are changed, the movable tap 215a is provided between the grounded ends of the resonance coil 212a. The power feeding part for the resonance coil 212a is constituted by the movable tap 215a.

A position of the movable tap 213b may be changed in order for the resonance characteristics of the resonance coil 212b to become approximately same as those of the high frequency power supply 283. In order to fine-tune an impedance of the resonance coil 212b when the substrate processing apparatus 100 is initially installed or when the processing conditions of the substrate processing apparatus 100 are changed, the movable tap 215b is provided between the grounded ends of the resonance coil 212b. The power feeding part for the resonance coil 212b is constituted by the movable tap 215b.

Since each of the resonance coil 212a and the resonance coil 212b includes a variable ground part (that is, the movable tap 213a or the movable tap 213b) and a variable power supply feeding part (that is, the power feeding part for the resonance coil 212a or the power feeding part for the resonance coil 212b), it is possible to easily adjust a resonance frequency and a load impedance of the process chamber 201.

A waveform adjustment circuit (not shown) constituted by a resonance coil (not shown) and a shield (not shown) is inserted into one end (or the other end or both ends) of each of the resonance coil 212a and the resonance coil 212b so that the phase current and the opposite phase current flow symmetrically with respect to each of electrical midpoints of the resonance coil 212a and the resonance coil 212b. The waveform adjustment circuit is configured to be open by setting each of the resonance coil 212a and the resonance coil 212b to an electrically disconnected state or an electrically equivalent state. The ends of each of the resonance coil 212a and the resonance coil 212b may be non-grounded by a choke series resistor, or may be DC-connected to a fixed reference potential.

A shield plate 223 is provided to shield an electric field outside of the resonance coil 212 and to form a capacitive component (also referred to as a "C component") of the resonance coil 212 necessary for constructing a resonance circuit between the shield plate 223 and the resonance coil 212a or the resonance coil 212b. In general, the shield plate 223 is made of a conductive material such as an aluminum alloy, and is of a cylindrical shape. The shield plate 223 is disposed, for example, about 5 mm to 150 mm apart from an outer periphery of each of the resonance coil 212a and the resonance coil 212b. In general, the shield plate 223 is grounded so that a potential of the shield plate 223 is equal to those of both ends of the resonance coil 212a and the resonance coil 212b. However, in order to accurately set the number of resonances of the resonance coil 212a and the resonance coil 212b, one or both ends of the shield plate 223 may be configured so that a tap position (or tap positions) of the shield plate 223 can be adjusted. Alternatively, in order to accurately set the number of the resonances, a trimming capacitance may be inserted between the shield plate 223 and each of the resonance coil 212a and the resonance coil 212b.

A first plasma generator is constituted mainly by the resonance coil 212a and the high frequency power supply part 271. A second plasma generator is constituted mainly by the resonance coil 212b and the high frequency power supply part 281. The first plasma generator and the second plasma generator may be collectively referred to as a "plasma generator".

Figure 3:
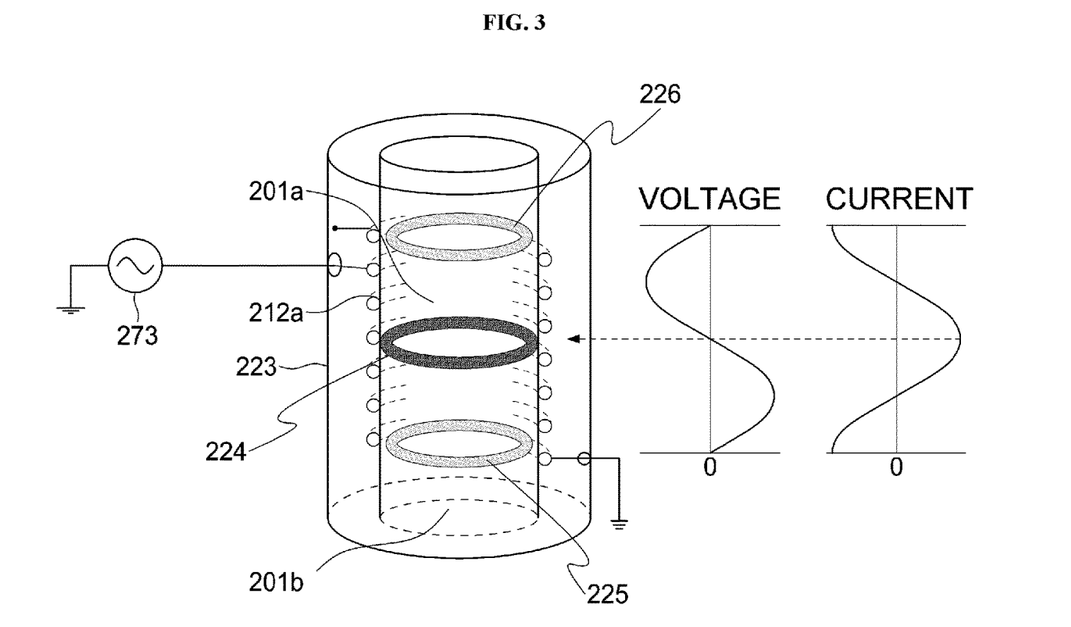
FIG. 3 schematically illustrates a principle of generating a plasma in the substrate processing apparatus.

Hereinafter, a principle of generating a plasma in the substrate processing apparatus 100 and the properties of the generated plasma will be described with reference to FIG. 3. Since the principle of generating the plasma by each of the resonance coil 212a and the resonance coil 212b is substantially the same, the principle of generating the plasma by the resonance coil 212a will be described hereafter as an example. When the following description applies to the principle of generating the plasma by the resonance coil 212b, the RF sensor 272, the high frequency power supply 273 and the matching device 274 are replaced by the RF sensor 282, the high frequency power supply 283 and the matching device 284, respectively.

A plasma generation circuit constituted by the resonance coil 212a is configured as an RLC parallel resonance circuit. When the wavelength of the high frequency power supplied from the high frequency power supply 273 and the electrical length of the resonance coil 212a are the same, the resonance condition of the resonance coil 212a is that a reactance component generated by a capacitance component or an inductive component of the resonance coil 212a is canceled out to become a pure resistance. However, when the plasma is generated in the plasma generation circuit described above, an actual resonance frequency may fluctuate slightly depending on conditions such as a variation (change) in a capacitive coupling between a voltage portion of the resonance coil 212a and the plasma, a variation in an inductive coupling between the plasma generation space 201a and the plasma and an excitation state of the plasma.

Therefore, according to the embodiments, in order to compensate for a resonance shift in the resonance coil 212a when the plasma is generated by adjusting the power supplied from the high frequency power supply 273, the RF sensor 272 is configured to detect the power of the reflected wave from the resonance coil 212a when the plasma is generated, and the matching device 274 is configured to correct the output of the high frequency power supply 273 based on the detected power of the reflected wave.

Specifically, the matching device 274 is configured to increase or decrease the impedance or the output frequency of the high frequency power supply 273 such that the power of the reflected wave is minimized based on the power of the reflected wave from the resonance coil 212a detected by the RF sensor 272 when the plasma is generated. In case the impedance is controlled by the matching device 274, the matching device 274 is constituted by a variable capacitor control circuit (not shown) capable of correcting a preset impedance. In case the output frequency of the high frequency power supply 273 is controlled by the matching device 274, the matching device 274 is constituted by a frequency control circuit (not shown) capable of correcting a preset oscillation frequency of the high frequency power supply 273. The high frequency power supply 273 and the matching device 274 may be provided integrally as a single body.

According to the configuration related to the resonance coil 212a described above, the high frequency power whose frequency is equal to the actual resonance frequency of the resonance coil 212a combined with the plasma is supplied to the resonance coil 212a (or the high frequency power is supplied to match an actual impedance of the resonance coil 212a combined with the plasma). Therefore, the standing wave in which the phase voltage thereof and the opposite phase voltage thereof are always canceled out by each other is generated in the resonance coil 212a. When the wavelength of the high frequency power and the electrical length of the resonance coil 212a are the same, the highest phase current is generated at an electric midpoint of the resonance coil 212a (node with zero voltage). Therefore, a donut-shaped induction plasma 224 is generated in the vicinity of the electric midpoint of the resonance coil 212a. The donut-shaped induction plasma 224 is hardly capacitively coupled with walls of the process chamber 201 or the substrate support 217. Similarly, a plasma 226 and a plasma 225 are generated at both ends of the resonance coil 212a according to the same principle.

Figure 4:
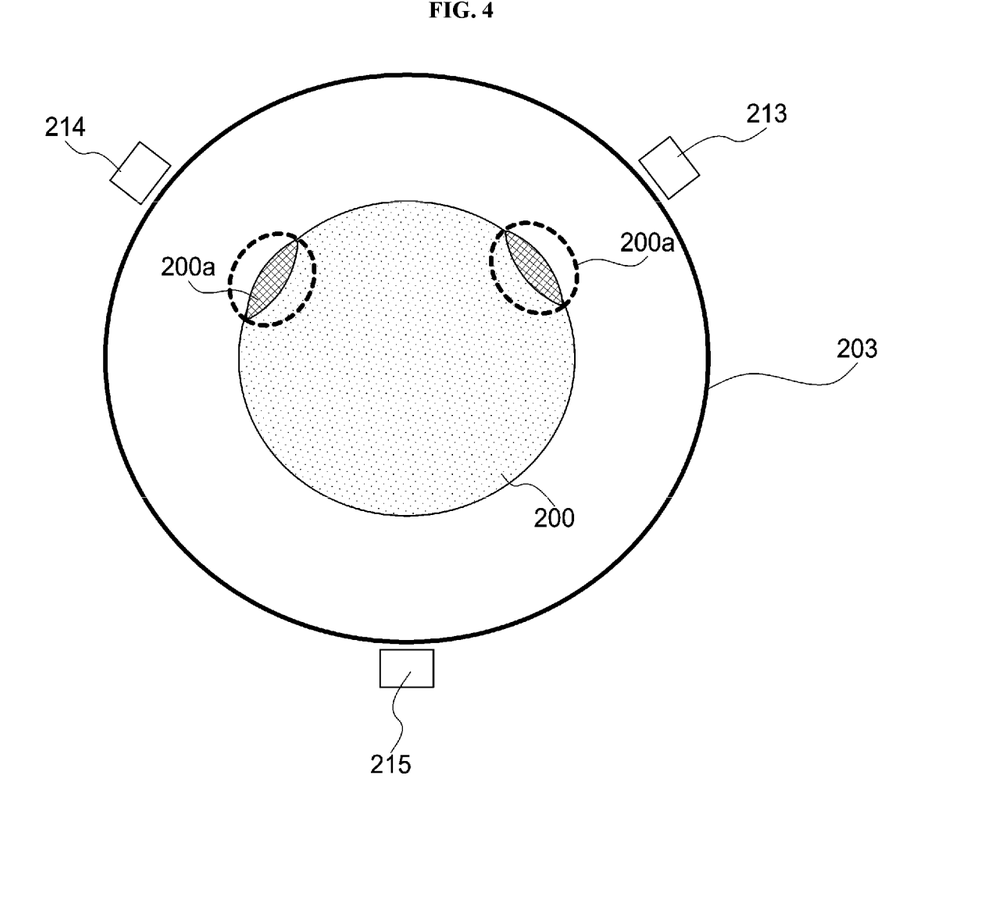
FIG. 4 schematically illustrates an influence of the plasma generated by the substrate processing apparatus.

As a result of intensive research, the inventors of the present application have discovered the following problems. One problem that will be described in detail with reference to FIG. 4 is that the plasma is affected by connecting the resonance coil 212 to the ground. As described above, the resonance coil 212 is connected to the ground via the movable taps 213 (that is, the movable tap 213a and the movable tap 213b) and the fixed grounds 214 (that is, the fixed ground 214a and the fixed ground 214b). A high phase current is generated around the movable taps 213 and the fixed grounds 214. When viewed from above as shown in FIG. 4, the high phase current is generated in the vicinity of the movable taps 213 and the fixed grounds 214 so that a plasma density is increased at portions close to the movable taps 213 and the fixed grounds 214. Then, on the substrate 200, the plasma density of portions 200a close to the movable taps 213 and the fixed grounds 214 increases, and the substrate processing on a surface of the substrate 200 may not be uniformized.

Another problem is that the generated plasma is of a donut shape. When the substrate 200 is disposed below the doughnut-shaped induction plasma, a distribution of the plasma density supplied to the substrate 200 may be different between a center portion of the substrate 200 and an outer peripheral portion of the substrate 200. That is, the plasma with a high energy is supplied to the outer peripheral portion of the substrate 200 immediately below the donut-shaped induction plasma. On the contrary, since the plasma density is low at a center of the doughnut-shaped induction plasma, the plasma with a low energy is supplied to the center portion of the substrate 200 immediately below the center of the doughnut-shaped induction plasma. Therefore, the substrate processing on the surface of the substrate 200 may be different between the outer peripheral portion and the center portion of the substrate 200.

Therefore, according to the embodiments, in order to process the surface of the substrate 200 uniformly, the outer peripheral portion of the substrate 200 is always kept not being below the doughnut-shaped induction plasma or not being close to the ground. Thereby, it is possible to improve a uniformity of the substrate processing on the surface of the substrate 200.

The details are described below. As described above, the plasma density tends to be higher at a portion of the resonance coil 212 close to the ground. According to the embodiments, the substrate support 217 is rotated. By rotating the substrate support 217, a relative position of a ground portion such as the movable tap 213a, the movable tap 213b, the fixed ground 214a and the fixed ground 214b relative to a specific point on the outer peripheral portion of the substrate 200 keeps changing constantly. Therefore, it is possible to balance out the influence of the portion where the plasma density is high.

The substrate 200 may be revolve around the specific axis. By revolving the substrate 200, a relative position of the ground portion such as the movable tap 213a, the movable tap 213b, the fixed ground 214a and the fixed ground 214b relative to a specific point on the outer peripheral portion of the substrate 200 keeps changing constantly. Therefore, it is possible to balance out the influence of the portion where the plasma density is high. In addition, below the doughnut-shaped induction plasma, the substrate 200 moves so as to always face an arc portion of the donut shape of the doughnut-shaped induction plasma. Therefore, it is possible to disperse the influence of the donut-shaped induction plasma. As a result, it is possible to balance out the influence of the plasma density.

Figure 5:
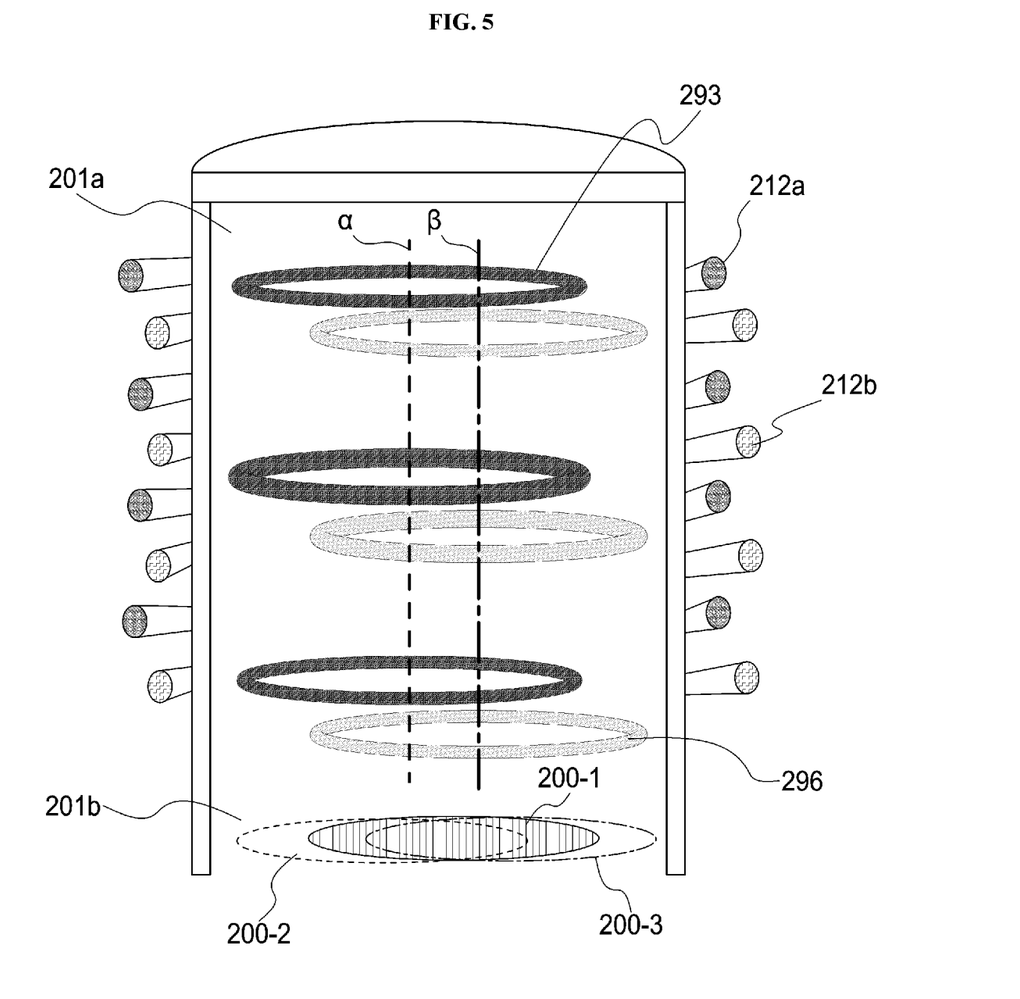
FIG. 5 schematically illustrates a relationship between a substrate and the plasma generated by the substrate processing apparatus.

In addition, as shown in FIGS. 1 and 5, two resonance coils whose center axes are displaced with each other may be used. For example, even when the substrate 200 is disposed at a position 200-1 shown in FIG. 5, that is, at a horizontal center position of the substrate processing space 201b, the substrate 200 is affected by two plasmas (that is, the donut-shaped induction plasma 293 generated by the resonance coil 212a and the donut-shaped induction plasma 296 generated by the resonance coil 212b). Therefore, it is possible to balance out the influence of the portion where the plasma density is high. In such a case, it is more preferable that the substrate 200 is rotated.

In addition, as shown in FIGS. 1 and 5, the substrate 200 may further revolve around the specific axis while using the two resonance coils 212a and 212b whose center axes are displaced with each other. For example, as shown in FIG. 5, the substrate 200 may revolve to move to positions indicated by reference numerals 200-1, 200-2, and 200-3, respectively. By revolving the substrate 200, the substrate 200 passes below the donut-shaped induction plasma 293 generated by the resonance coil 212a (or below its center portion) or below the donut-shaped induction plasma 296 generated by the resonance coil 212b (or below its center portion). Therefore, it is possible to balance out the influence of the portion where the plasma density is high. In such a case, it is more preferable that the substrate 200 is rotated.

Figure 6:
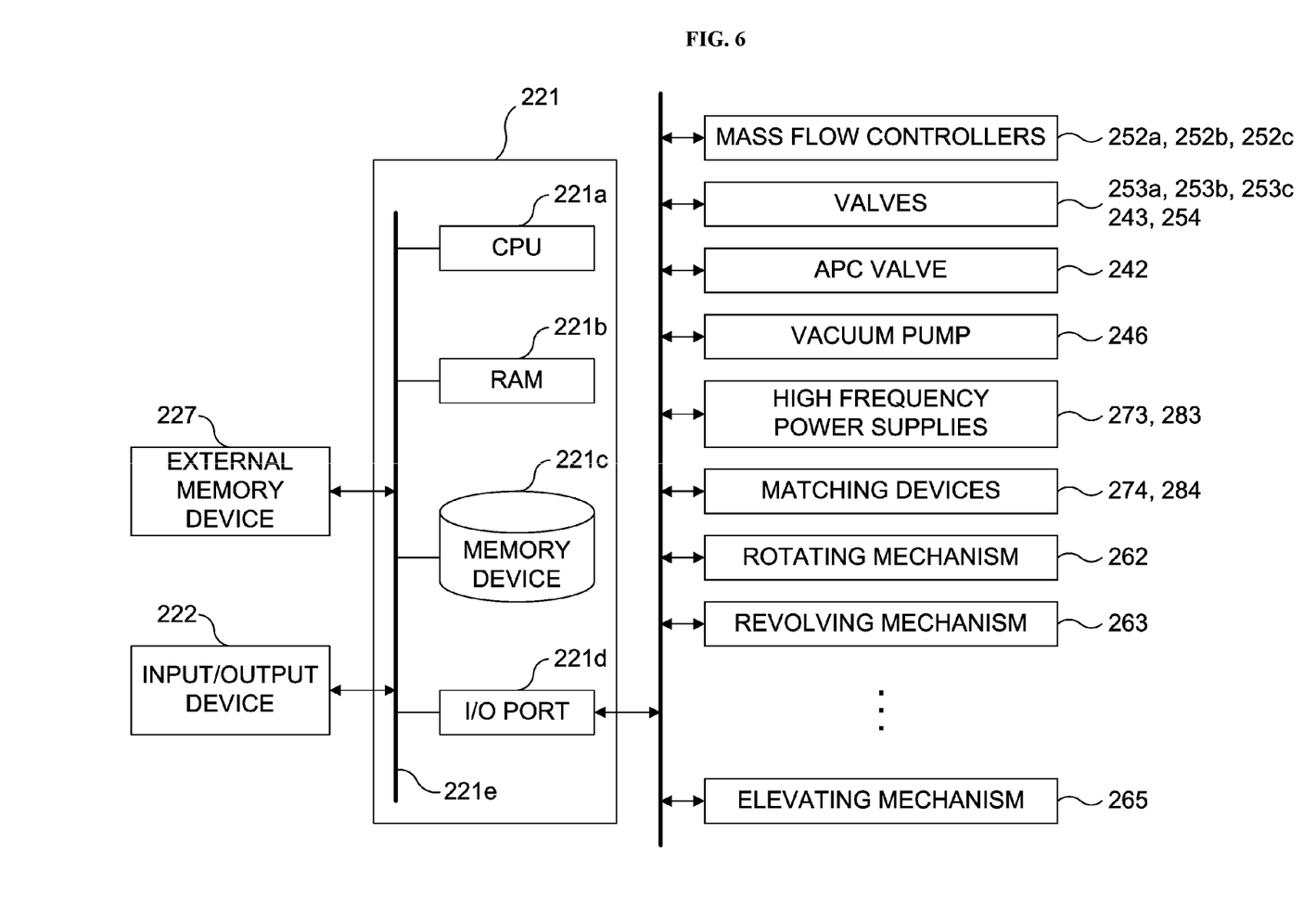
FIG. 6 is a block diagram schematically illustrating a configuration of a controller and related components of the substrate processing apparatus.

Controller controller 221 serving as a control device is configured to control the components described above such as the MFCs 252a through 252c, the valves 253a through 253c, 243 and 254, the gate valve 244, the APC valve 242, the vacuum pump 246, the high frequency power supplies 273 and 283, the matching devices 274 and 284, and the rotating mechanism 262, the revolving mechanism 263 and the elevating mechanism 265.

As shown in FIG. 6, the controller 221 serving as a control device (also referred to as a "control mechanism") is embodied by a computer including a CPU (Central Processing Unit) 221a, a RAM (Random Access Memory) 221b, a memory device 221c and an I/O port 221d. The RAM 221b, the memory device 221c and the I/O port 221d may exchange data with the CPU 221a through an internal bus 221e. For example, an input/output device 222 such as a touch panel (not shown) and a display (not shown) is connected to the controller 221.

The memory device 221c may be embodied by components such as a flash memory and a HDD (Hard Disk Drive). Components such as a control program configured to control the operation of the substrate processing apparatus 100 and a process recipe in which information such as the order and the conditions of the substrate processing described later is stored are readably stored in the memory device 221c. The process recipe is obtained by combining steps of the substrate processing described later such that the controller 221 can execute the steps to acquire a predetermine result, and functions as a program. Hereinafter, the process recipe and the control program are collectively referred to as a "program". In the present specification, the term "program" may indicate only the process recipe, may indicate only the control program, or may indicate both of the process recipe and the control program. The RAM 221b functions as a memory area (work area) where a program or data read by the CPU 221a is temporarily stored.

The I/O port 221d is electrically connected to the components described above such as the MFCs 252a through 252c, the valves 253a through 253c, 243 and 254, the gate valve 244, the APC valve 242, the vacuum pump 246, the high frequency power supplies 273 and 283, the matching devices 274 and 284, and the rotating mechanism 262, the revolving mechanism 263 and the elevating mechanism 265.

The CPU 221a is configured to read and execute the control program stored in the memory device 221c, and to read the process recipe stored in the memory device 221c in accordance with an instruction such as an operation command inputted via the input/output device 222. The CPU 221a is configured to control the operations of the components of the substrate processing apparatus 100 according to the process recipe.

The controller 221 may be embodied by preparing an external memory device 227 storing the program and by installing the program onto a computer using the external memory device 227. For example, the external memory device 227 may include a magnetic tape, a magnetic disk such as a flexible disk and a hard disk, an optical disk such as a CD and a DVD, a magneto-optical disk such as an MO and a semiconductor memory such as a USB memory and a memory card. The memory device 221c or the external memory device 227 may be embodied by a non-transitory computer readable recording medium. Hereafter, the memory device 221c and the external memory device 227 may be individually or collectively referred to as a recording medium. In the present specification, the term "recording medium" may refer to only the memory device 221c, may refer to only the external memory device 227 or may refer to both of the memory device 221c and the external memory device 227. The program may be provided to the computer without using the external memory device 227. For example, the program may be supplied to the computer using communication means such as the Internet and a dedicated line.

(2) Substrate Processing

Figure 7:
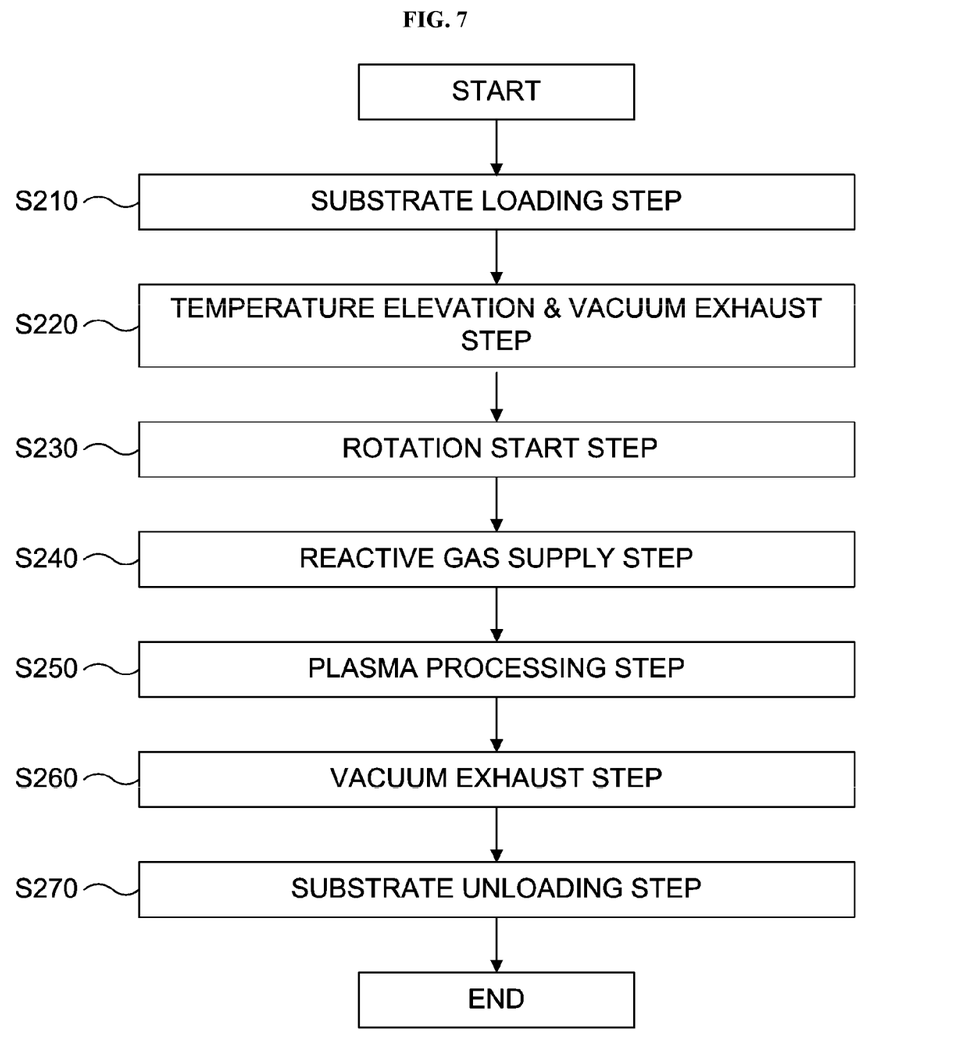
FIG. 7 is a flowchart schematically illustrating a substrate processing according to the embodiments described herein.
Figure 8:
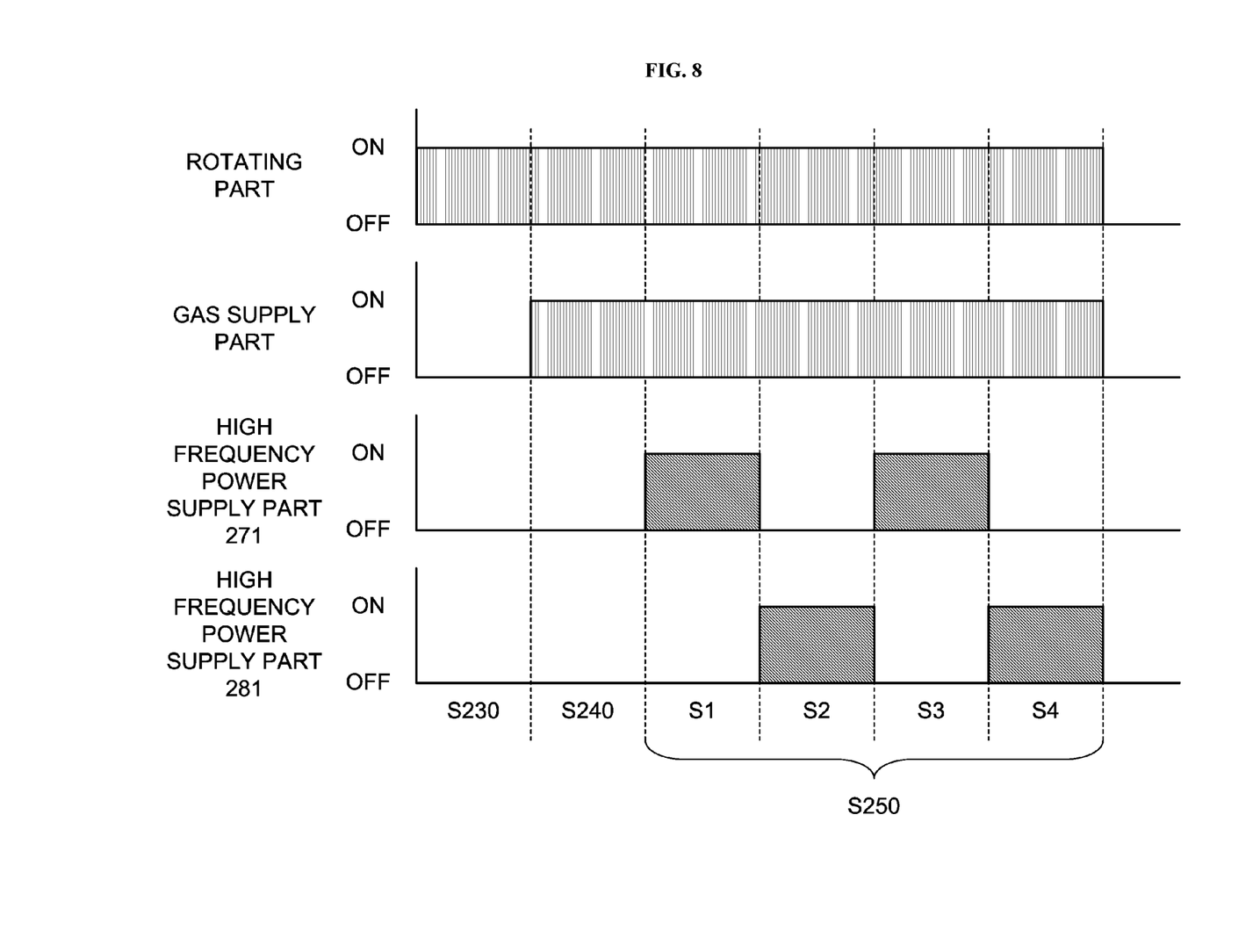
FIG. 8 schematically illustrates operation states of components of the substrate processing apparatus when the substrate processing is performed.

Subsequently, the substrate processing according to the embodiments will be described with reference to FIGS. 7 and 8. FIG. 7 is a flowchart schematically illustrating the substrate processing according to the embodiments. FIG. 8 schematically illustrates operation states of the components of the substrate processing apparatus 100 when the substrate processing is performed, in particular, when a plasma processing step S250 is performed. For example, the substrate processing, which is a part of manufacturing processes of a semiconductor device such as a flash memory, is performed by the substrate processing apparatus 100 described above. In the following description, the operations of the components of the substrate processing apparatus 100 are controlled by the controller 221.

Figure 9:
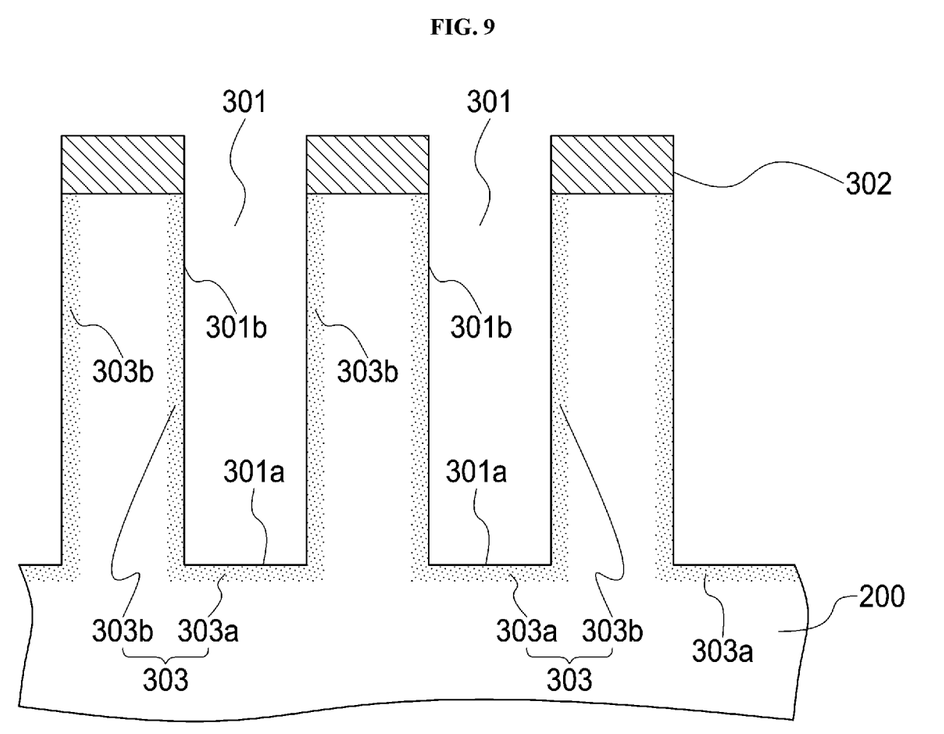
FIG. 9 schematically illustrates an example of the substrate with a groove (also referred to as a "trench") formed thereon to be processed according to the substrate processing.

For example, as shown in FIG. 9, a trench (also referred to as a "groove") 301 whose surface is at least made of a silicon layer is formed in advance on the surface of the substrate 200 to be processed by the substrate processing according to the embodiments. In addition, the trench 301 includes a concave-convex portion of a high aspect ratio. According to the embodiments, for example, the oxidation process serving as the substrate processing process using the plasma is performed to oxidize the silicon layer exposed on an inner wall of the trench 301. For example, the trench 301 is formed by forming a mask layer 302 having a predetermined pattern on the substrate 200 and etching the surface of the substrate 200 to a predetermined depth.

Substrate Loading Step S210

A substrate loading step S210 will be described. First, the substrate 200 is transferred (loaded) into the process chamber 201. Specifically, the substrate support 217 is lowered to a position for transferring the substrate 200 (also referred to as a "substrate transfer position") by the elevating mechanism 265.

Subsequently, the gate valve 244 is opened, and the substrate 200 is loaded into the process chamber 201 using the substrate transfer mechanism (not shown) from a vacuum transfer chamber provided adjacent to the process chamber 201. The substrate 200 loaded into the process chamber 201 is then placed on the substrate placing surface 217a. Thereafter, the substrate transfer mechanism is retracted out of the process chamber 201, and the gate valve 244 is closed to seal the process chamber 201. Thereafter, the substrate support 217 is further elevated by the elevating mechanism 265 until the substrate 200 is at a position (also referred to as a "substrate processing position") for processing the substrate 200.

Temperature Elevation and Vacuum Exhaust Step S220

A temperature elevation and vacuum exhaust step S220 will be described. In the temperature elevation and vacuum exhaust step S220, a temperature of the substrate 200 loaded into the process chamber 201 is elevated. The heater 217b embedded in the substrate support 217 is heated in advance. By placing the substrate 200 on the substrate support 217 where the heater 217b is embedded, for example, the substrate 200 is heated to a predetermined temperature within a range from 150° C. to 850° C. According to the embodiments, for example, the predetermined temperature of the substrate 200 is 600° C. While the substrate 200 is being heated, the vacuum pump 246 vacuum-exhausts an inner atmosphere of the process chamber 201 through the gas exhaust pipe 231 such that an inner pressure of the process chamber 201 is at a predetermined pressure. The vacuum pump 246 vacuum-exhausts the inner atmosphere of the process chamber 201 at least until a substrate unloading step S270 described later is completed.

Rotation Start Step S230

A rotation start step S230 will be described. In the rotation start step S230, the controller 221 controls the rotating part to start rotation or revolution of the substrate support 217. When the substrate support 217 is rotated, the controller 221 controls the rotating mechanism 262. When the substrate support 217 revolves around the specific axis, the controller 221 controls the revolving mechanism 263. When the substrate support 217 is rotated and revolves, the controller 221 controls the rotating mechanism 262 and the revolving mechanism 263.

Reactive Gas Supply Step S240

A reactive gas supply step S240 will be described. When the rotation of the substrate support 217 is stabilized, the oxygen ($O_2$) gas serving as the oxygen-containing gas and the hydrogen ($H_2$) gas serving as the hydrogen-containing gas are supplied into the process chamber 201 as the reactive gas. Specifically, the valves 253a and 253b are opened to supply the $O_2$ gas and the $H_2$ gas into the process chamber 201 while the flow rates of the $O_2$ gas and the $H_2$ gas are adjusted by the MFCs 252a and 252b, respectively. In the reactive gas supply step S240, for example, the flow rate of the $O_2$ gas is set to a predetermined flow rate within a range from 20 sccm to 2,000 sccm, preferably from 20 sccm to 1,000 sccm. In addition, for example, the flow rate of the $H_2$ gas is set to a predetermined flow rate within a range from 20 sccm to 1,000 sccm, preferably from 20 sccm to 500 sccm. More preferably, a total flow rate of the $O_2$ gas and the $H_2$ gas is set to 1,000 sccm, and a ratio of the flow rate of the $O_2$ gas to the flow rate of the $H_2$ gas (that is, a flow rate ratio of the $O_2$ gas to the $H_2$ gas) is set to be equal to or greater than 950/50.

In the reactive gas supply step S240, the inner atmosphere of the process chamber 201 is exhausted by adjusting an opening degree of the APC valve 242 such that the inner pressure of the process chamber 201 is at a predetermined pressure within a range from 1 Pa to 250 Pa, preferably from 50 Pa to 200 Pa, and more preferably about 150 Pa. The $O_2$ gas and the $H_2$ gas are continuously supplied into the process chamber 201 while appropriately exhausting the inner atmosphere of the process chamber 201 until the plasma processing step S250 described later is completed.

Plasma Processing Step S250

The plasma processing step S250 will be described. The plasma processing step S250 will be described in detail with reference to FIG. 8. In FIG. 8, steps S1 through S4 correspond to the plasma processing step S250. In the step S1, when the supply of the reactive gas (that is, the $O_2$ gas and the $H_2$ gas) is stabilized, while supplying the reactive gas continuously, the high frequency power supply part 271 supplies the high frequency power to the resonance coil 212a. In the step S1, the high frequency power supply part 281 does not supply the high frequency power to the resonance coil 212b.

Specifically, when the inner pressure of the process chamber 201 is stabilized, the high frequency power is applied to the resonance coil 212a from the high frequency power supply 273 via the RF sensor 272. According to the embodiment, for example, the high frequency power of 27.12 MHz is supplied from the high frequency power supply 273 to the resonance coil 212a. For example, the high frequency power of 27.12 MHz supplied to the resonance coil 212a is a predetermined power within a range from 100 W to 5,000 W, preferably 100 W to 3,500 W, and more preferably about 3,500 W. When the predetermined power is lower than 100 W, it is difficult to stably generate a plasma discharge.

Thereby, a high frequency electric field is formed in the plasma generation space 201a to which the $O_2$ gas and the $H_2$ gas are supplied, and the donut-shaped induction plasma 293 of a high plasma density is excited by the electric field. The $O_2$ gas and the $H_2$ gas are activated by the excited plasma and dissociate. As a result, reactive species such as oxygen radicals (also referred to as oxygen active species) containing oxygen atoms, oxygen ions, hydrogen radicals (also referred to as hydrogen active species) containing hydrogen atoms and hydrogen ions may be generated.

The radicals generated by the induction plasma (that is, the donut-shaped induction plasma 293) and non-accelerated ions such as the oxygen ions and the hydrogen ions are uniformly supplied into the groove 301 of the substrate 200 placed on the substrate support 217 in the substrate processing space 201b.

In the step S1, since the substrate 200 is rotated and/or revolves, a relative position of the ground portion (or the portion of the donut-shaped induction plasma 293 where the plasma density is high) relative to a specific point on the substrate 200 keep changing constantly. Therefore, it is possible to balance out the influence of the portion where the plasma density is high. It is also possible to uniformly process the substrate 200.

The radicals and the ions supplied into the groove 301 of the substrate 200 uniformly react with a bottom wall 301a and a side wall 301b over an entire surface of the substrate 200, and the silicon layer on the surface of the groove 301 is modified into a silicon oxide layer 303 of a good step coverage. Specifically, the bottom wall 301a is modified into an oxide layer 303a, and the side wall 301b is modified into an oxide layer 303b. After a predetermined process time elapses (for example, 10 seconds to 300 seconds), the step S3 is performed.

Subsequently, the step S2 will be described. In the step S2, while supplying the reactive gas continuously through the gas supply part 255, the high frequency power supply part 281 supplies the high frequency power to the resonance coil 212b. In the step S2, the supply of the high frequency power from the high frequency power supply part 271 to the resonance coil 212a is stopped.

Specifically, similar to the step S1, when the inner pressure of the process chamber 201 is stabilized, the high frequency power is applied to the resonance coil 212b from the high frequency power supply 283 via the RF sensor 282. According to the embodiment, for example, the high frequency power of 27.12 MHz is supplied from the high frequency power supply 283 to the resonance coil 212b. For example, the high frequency power of 27.12 MHz is supplied to the resonance coil 212b is a predetermined power within a range from 100 W to 5,000 W, preferably 100 W to 3,500 W, and more preferably about 3,500 W. When the predetermined power is lower than 100 W, it is difficult to stably generate a plasma discharge.

Thereby, a high frequency electric field is formed in the plasma generation space 201a to which the $O_2$ gas and the $H_2$ gas are supplied, and the donut-shaped induction plasma 296 of a high plasma density is excited by the electric field. The $O_2$ gas and the $H_2$ gas are activated by the excited plasma and dissociate. As a result, reactive species such as oxygen radicals (also referred to as oxygen active species) containing oxygen atoms, oxygen ions, hydrogen radicals (also referred to as hydrogen active species) containing hydrogen atoms and hydrogen ions may be generated. In addition, since the energy is added to the radicals generated in the step S1 by the electric field formed in the step S2, it is possible to extend the lifetime of the radicals generated in the step S1.

The radicals (and the ions) generated by the induction plasma (that is, the donut-shaped induction plasma 296) and the radicals (and the ions) generated in the step S1 and whose lifetime is extended by the electric field formed in the step S2 are uniformly supplied into the groove 301 of the substrate 200. The radicals (and the ions) supplied into the groove 301 of the substrate 200 in the step S2 uniformly react with the bottom wall 301a and the side wall 301b without being deactivated, and the silicon layer on the surface of the groove 301 is modified into the silicon oxide layer 303 of a good step coverage.

Similar to the step S1, in the step S2, since the substrate 200 is rotated and/or revolves, a relative position of the ground portion (or the portion of the donut-shaped induction plasma where the plasma density is high) relative to a specific point on the substrate 200 keeps changing constantly. Therefore, it is possible to balance out the influence of the portion where the plasma density is high. It is also possible to uniformly process the substrate 200.

After a predetermined process time elapses (for example, 10 seconds to 300 seconds), the supply of the high frequency power from the high frequency power supply part 281 to the resonance coil 212b is stopped. In addition, the valves 253a and 253b are closed to stop the supply of the $O_2$ gas and the $H_2$ gas into the process chamber 201. Thereby, the plasma processing step S250 is completed.

The step S3 similar to the step S1 and the step S4 similar to the step S2 may be further performed, or a cycle including the step S1, the step S2, the step S3 and the step S4 may be repeatedly performed according to dimensions such as the width or depth of the groove 301, the height of the upper vessel 210.

Vacuum Exhaust Step S260

After the supply of the $O_2$ gas and the $H_2$ gas is stopped, the inner atmosphere of the process chamber 201 is vacuum-exhausted through the gas exhaust pipe 231. As a result, the gas such as the $O_2$ gas, the $H_2$ gas and an exhaust gas generated by the reaction between the $O_2$ gas and the $H_2$ gas is exhausted to the outside of the process chamber 201. Thereafter, the opening degree of the APC valve 242 is adjusted such that the inner pressure of the process chamber 201 is adjusted to the same pressure as that of the vacuum transfer chamber (not shown) provided adjacent to the process chamber 201. For example, the inner pressure of the process chamber 201 is adjusted to 100 Pa. The substrate 200 is then unloaded to the vacuum transfer chamber in the substrate unloading step S270.

Substrate Unloading Step S270

After the inner pressure of the process chamber 201 reaches a predetermined pressure, the substrate support 217 is lowered to the substrate transfer position. Then, the gate valve 244 is opened and the substrate 200 is unloaded from the process chamber 201 to the outside of the process chamber 201 by using the substrate transfer mechanism (not shown). Then, the substrate 200 may be transferred to the vacuum transfer chamber. Thereby, the substrate processing according to the embodiments is completed.

While the embodiments described above are mainly described by way of an example in which the $O_2$ gas and the $H_2$ gas are excited by the plasma and supplied to the substrate 200 to process the substrate 200 by the plasma, the embodiments are not limited thereto. For example, the $N_2$ gas may be supplied into the process chamber 201 instead the $O_2$ gas, and the $N_2$ gas and the $H_2$ gas may be excited by the plasma to perform the nitridation process on the substrate 200. In such a case, the substrate processing apparatus 100 including the nitrogen-containing gas supply system described above instead of the oxygen-containing gas supply system described above may be used to perform the nitridation process.

While the embodiments described above are mainly described by way of an example in which two high frequency power supply parts (that is, the high frequency power supply part 271 and the high frequency power supply part 281) are used, the embodiments are not limited thereto. For example, as long as the high frequency power supplied to each of the resonance coil 212a and the resonance coil 212b does not overlap with each other, one high frequency power supply part may be connected to the resonance coil 212a and the resonance coil 212b via a switch (not shown). In such a case, in the step S1, the resonance coil 212a is connected to the one high frequency power supply part described above, and in the step S2, the switch is switched to connect the resonance coil 212b to the one high frequency power supply part described above.

While the embodiments described above are mainly described by way of an example in which two resonance coils (that is, the resonance coil 212a and the resonance coil 212b) are used, the embodiments are not limited thereto. For example, three or more resonance coils may be used.

OTHER EMBODIMENTS

While the embodiments described above are mainly described by way of an example in which the plasma is used to perform the process such as the oxidation process and the nitridation process on the surface of the substrate, the above-described technique is not limited thereto. For example, the above-described technique may also be applied to other processes using the plasma to process the substrate. For example, the above-described technique may be applied to other processes using the plasma such as a modification process (or a doping process) on a film formed on the surface of the substrate, a reduction process of an oxide film, an etching process of the film, an ashing process of a photoresist and a film-forming process.

According to some embodiments in the present disclosure, it is possible to uniformly process a surface of a substrate even when an inductive coupling type substrate processing apparatus is used to process the substrate.

What is claimed is:

1. A substrate processing apparatus comprising:
   a process chamber in which a substrate is processed;
   a gas supply part configured to supply a gas into the process chamber;
   a high frequency power supply part configured to supply a high frequency power of a predetermined frequency;
   a plasma generator comprising:
      a resonance coil comprising a first resonance coil and a second resonance coil that are wound on a side of the process chamber; and
      a movable tap provided at least one end of the first resonance coil and the second resonance coil,
      wherein the plasma generator is configured to generate a plasma in the process chamber when the high frequency power is supplied to the resonance coil;
   a plasma generation space provided adjacent to the resonance coil; and
   a substrate support on which the substrate is placed such that a horizontal center position of the substrate in the process chamber does not overlap with a horizontal center position of the resonance coil,
   wherein, while the plasma generator generates the plasma, the substrate rotates or revolves at a location below the plasma generation space and a relative position of the movable tap with respect to a specific point on an outer peripheral portion of the substrate is changed.

2. The substrate processing apparatus of claim 1, the first resonance coil and the second resonance coil are provided such that a horizontal center position of the first resonance coil does not overlap with a horizontal center position of the second resonance coil.

3. The substrate processing apparatus of claim 1, wherein the plasma generation space is formed in the process chamber, and
the substrate support is provided in a substrate processing space below the plasma generation space.

4. The substrate processing apparatus of claim 1, wherein a winding pitch of the first resonance coil is at equal intervals.

5. The substrate processing apparatus of claim 1, wherein a diameter of the first resonance coil is set to be greater than a diameter of the substrate.

6. The substrate processing apparatus of claim 1, wherein a winding pitch of the second resonance coil is at equal intervals.

7. The substrate processing apparatus of claim 1, wherein a diameter of the second resonance coil is set to be greater than a diameter of the substrate.

8. A non-transitory computer-readable recording medium storing a program that causes, by a computer, the substrate processing apparatus of claim 1 to process the substrate.

9. A method of manufacturing a semiconductor device using the substrate processing apparatus of claim 1, the method comprising: processing the substrate.

10. A substrate processing method using the substrate processing apparatus of claim 1, the method comprising: processing the substrate.

* * * * *